(12) United States Patent
Takita

(10) Patent No.: US 7,569,842 B2
(45) Date of Patent: Aug. 4, 2009

(54) METHOD FOR CORRECTING ELECTRON BEAM EXPOSURE DATA

(75) Inventor: Hiroshi Takita, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 108 days.

(21) Appl. No.: 11/506,171

(22) Filed: Aug. 18, 2006

(65) Prior Publication Data

US 2006/0284120 A1     Dec. 21, 2006

Related U.S. Application Data

(63) Continuation of application No. PCT/JP2004/004513, filed on Mar. 30, 2004.

(51) Int. Cl.
*H01J 37/08* (2006.01)
*G21K 5/00* (2006.01)
*G03C 5/00* (2006.01)
*G06F 17/50* (2006.01)

(52) U.S. Cl. .................. 250/492.22; 250/492.23; 430/394; 716/21

(58) Field of Classification Search .............. 250/492.1, 250/492.2, 492.22, 492.3; 430/4, 5, 30, 296–299, 430/310–314, 316, 322, 323, 394, 942; 716/19, 716/21
See application file for complete search history.

(56) References Cited

U.S. PATENT DOCUMENTS

| | | | | |
|---|---|---|---|---|
| 4,500,789 A | * | 2/1985 | Ban et al. | 250/492.2 |
| 5,436,095 A | * | 7/1995 | Mizuno et al. | 430/5 |
| 5,693,453 A | * | 12/1997 | Muroya | 430/296 |
| 5,804,339 A | * | 9/1998 | Kim | 430/5 |
| 5,849,437 A | * | 12/1998 | Yamazaki et al. | 430/5 |
| 6,243,487 B1 | * | 6/2001 | Nakajima | 382/144 |
| 6,316,163 B1 | * | 11/2001 | Magoshi et al. | 430/296 |
| 6,370,441 B1 | * | 4/2002 | Ohnuma | 700/121 |
| 6,383,693 B1 | * | 5/2002 | Wu et al. | 430/5 |
| 7,205,078 B2 | * | 4/2007 | Osawa et al. | 430/30 |
| 7,365,324 B2 | * | 4/2008 | Noji et al. | 250/310 |
| 2003/0026472 A1 | * | 2/2003 | Abe | 382/144 |
| 2003/0027064 A1 | | 2/2003 | Ki | |
| 2003/0124442 A1 | * | 7/2003 | Yang | 430/30 |

(Continued)

FOREIGN PATENT DOCUMENTS

JP     07-066098     3/1995

(Continued)

OTHER PUBLICATIONS

PCT International Preliminary Report on Patentability, mailed Dec. 7, 2006, and issued in corresponding International Application No. PCT/JP2004/004513.

(Continued)

*Primary Examiner*—Bernard E Souw
(74) *Attorney, Agent, or Firm*—Staas & Halsey LLP

(57) ABSTRACT

First, electron beam exposure data identifiable for each type of pattern of a semiconductor device is inputted (S601). Then, electron beam exposure data on a first type of pattern is not corrected, while electron beam exposure data on a second type of pattern is corrected (S603). The first type of pattern is, for example, a dummy pattern having no influence on the function of the semiconductor device. The second type of pattern is for example, a normal pattern having an influence on the function of the semiconductor device.

15 Claims, 16 Drawing Sheets

U.S. PATENT DOCUMENTS

2006/0284120 A1* 12/2006 Takita ................... 250/492.22
2008/0050676 A1*  2/2008 Hoshino .................... 430/296

FOREIGN PATENT DOCUMENTS

| JP | 07-094378 | 4/1995 |
| JP | 09-298145 | 11/1997 |
| JP | 10-090878 | 4/1998 |
| JP | 10-199785 | 7/1998 |
| JP | 10-275762 | 10/1998 |
| JP | 10-301255 | 11/1998 |
| JP | 11-154635 | 6/1999 |
| JP | 11-354423 | 12/1999 |
| JP | 2000-269126 | 9/2000 |
| JP | 2001-125252 | 5/2001 |
| JP | 2001-267223 | 9/2001 |
| JP | 2004177783 | * 6/2004 |

OTHER PUBLICATIONS

International Search Report dated Jul. 6, 2004 in corresponding PCT Patent Application No. PCT/JP2004/004513.

Boegli, et al., "Implementation of real-time proximity effect correction in a raster shaped beam tool" Journal of Vacuum Science & Technology B: Microelectronics processing and Phenomena, American Vacuum Society, New York, NY, US, vol. 18, No. 6, Nov. 1, 2000, pp. 3138-3142.

European Patent Office Communication dated Apr. 16, 2009 for corresponding European Patent Application No. 04724406.6-1226.

* cited by examiner

F I G. 1
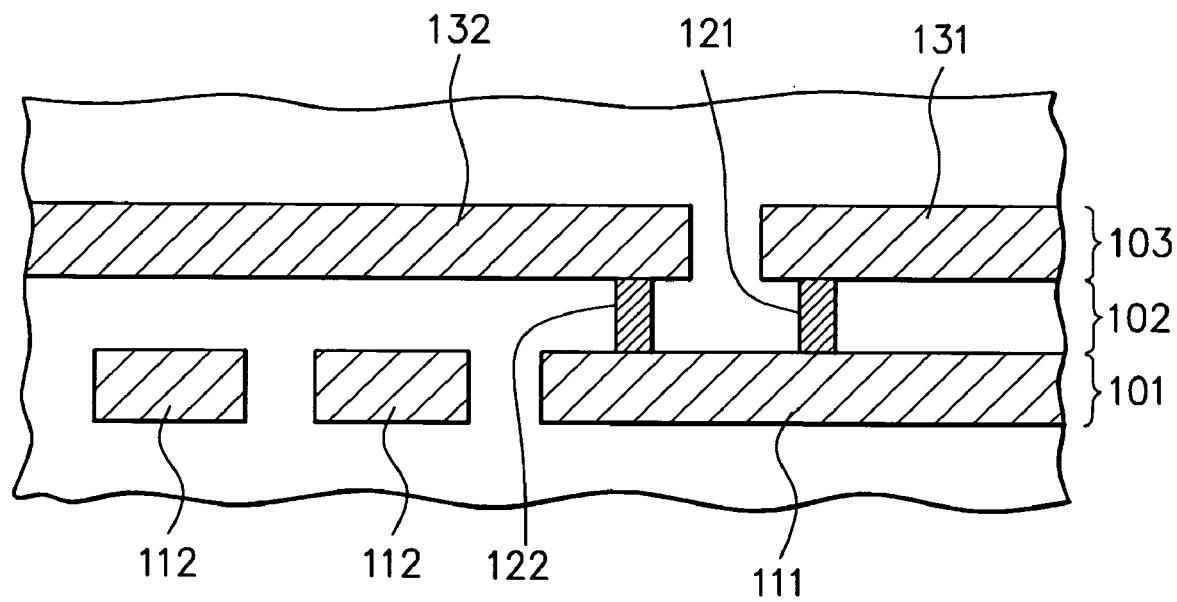

F I G. 5
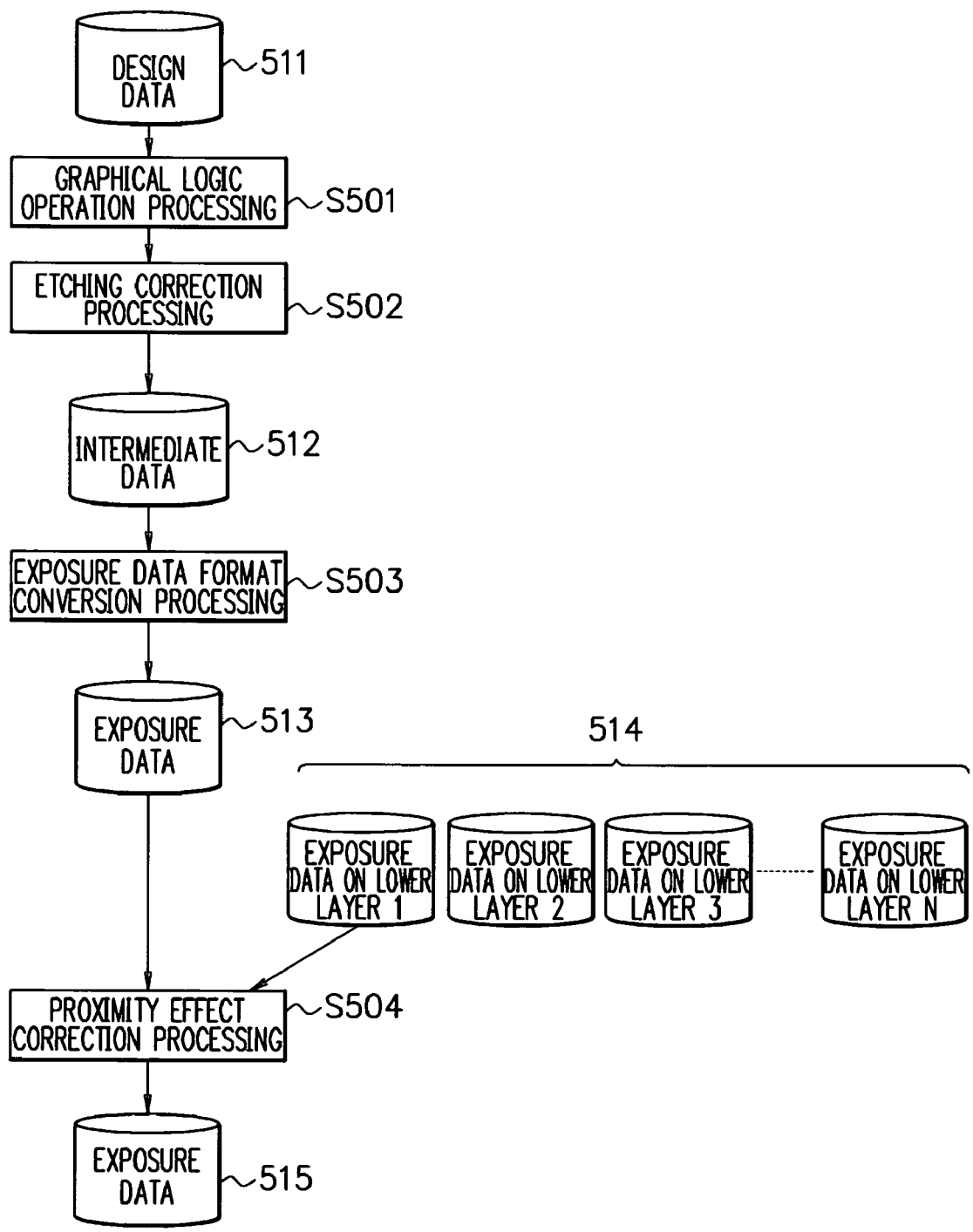

F I G. 13
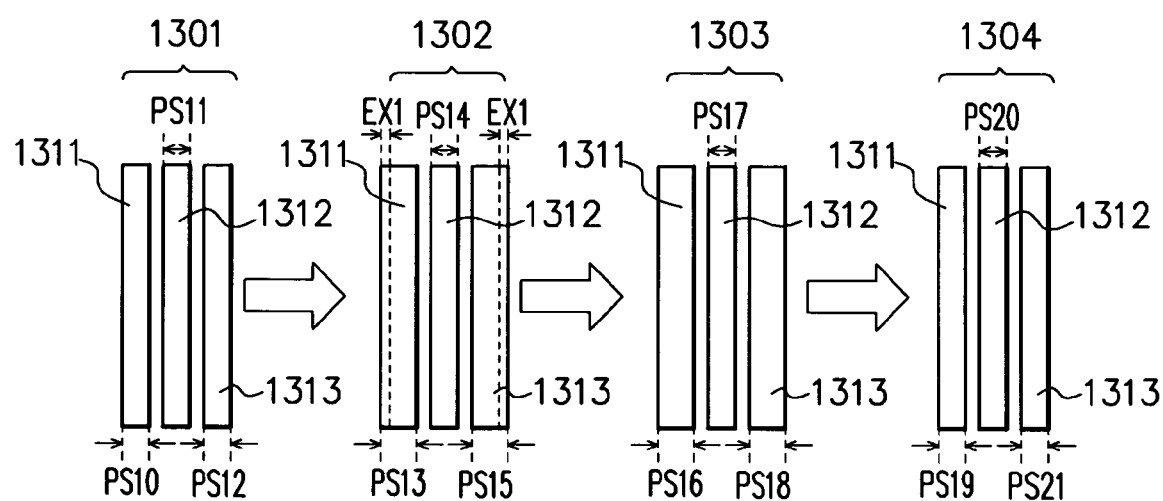

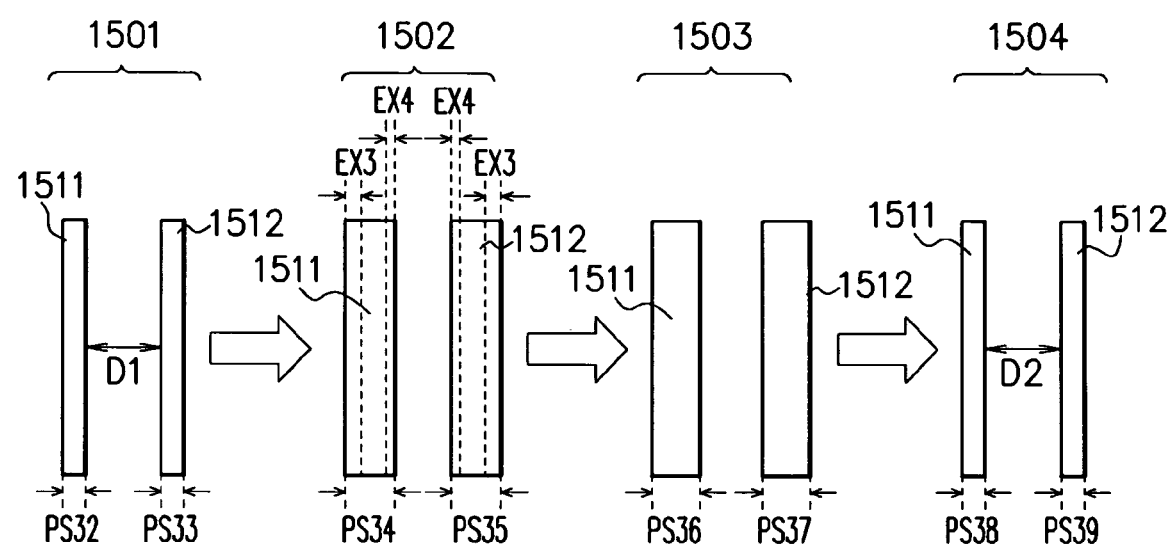
F I G. 15

F I G. 16
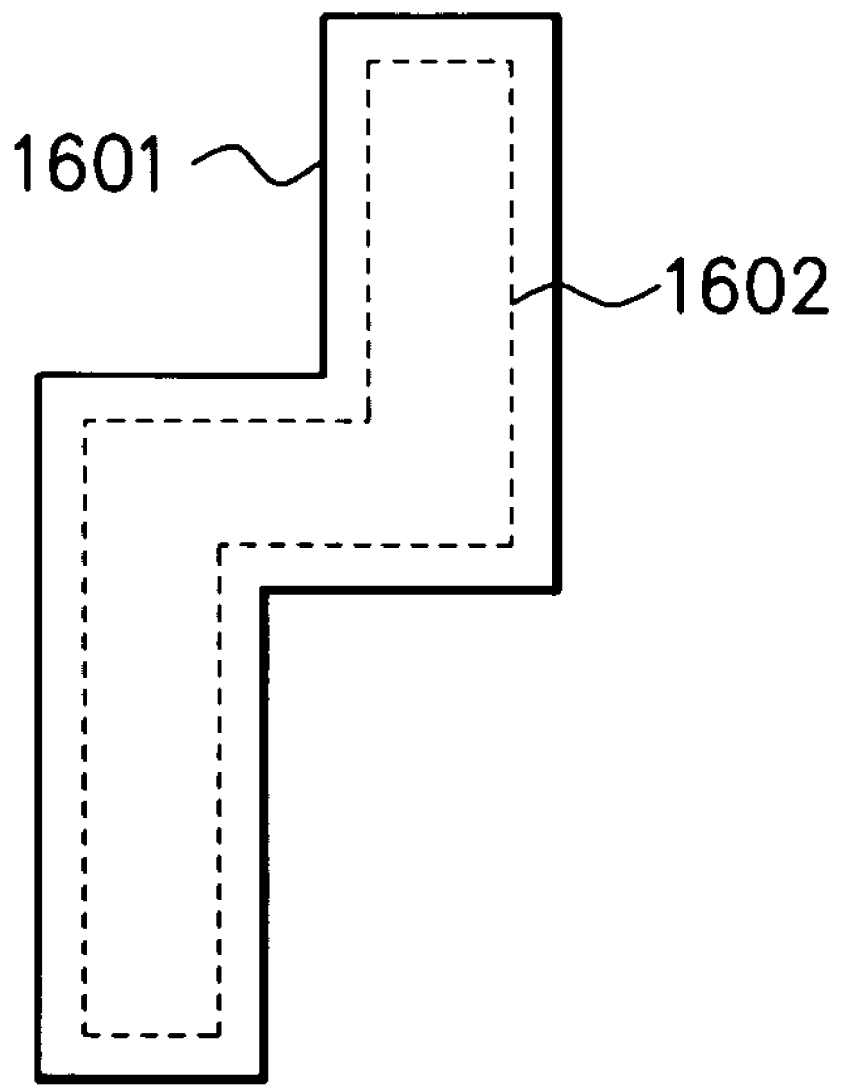

F I G. 18
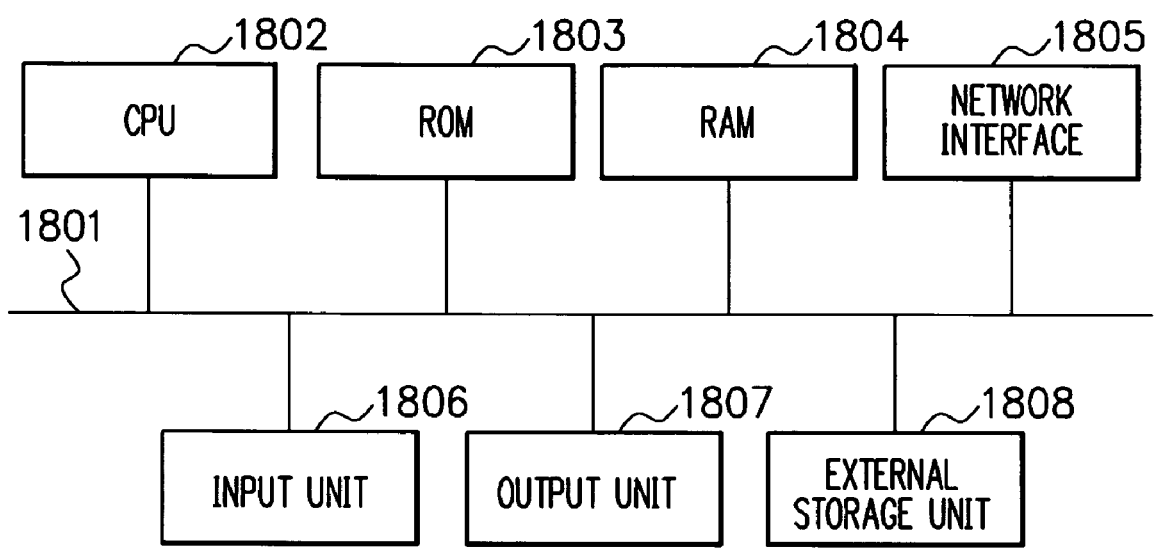

METHOD FOR CORRECTING ELECTRON BEAM EXPOSURE DATA

CROSS-REFERENCE TO RELATED APPLICATIONS

This application is a continuing application, filed under 35 U.S.C. §111(a), of International Application PCT/JP2004/004513, filed on Mar. 30, 2004, herein incorporated by reference.

TECHNICAL FIELD

The present invention relates to electron beam exposure, and particularly relates to correction of electron beam exposure data.

BACKGROUND ART

A method for manufacturing a semiconductor device includes steps of exposure, development, and etching. In exposure, an ultraviolet ray or an electron beam is irradiated to a resist. The resist with a predetermined pattern is formed by developing the resist. At this time, due to a proximity effect, distortion occurs in the developed resist pattern compared with an exposure pattern. Therefore, a proximity effect correction is performed. By making a correction to a pattern shape of a mask when a resist in a minute region is exposed, the proximity effect correction can prevent a deformation of the resist pattern caused by an influence of other exposure regions.

In the following Patent Document 1, a proximity effect correction method is described. In the following Patent Document 2, a proximity effect correction method when electron beam transfer exposure is performed on a substrate where a base layer is formed is described. In the following Patent Document 3, a method for correcting a proximity effect caused depending on surrounding circumstances of a pattern is described. In the following Patent Document 4, it is disclosed that the exposure amount of an electron beam is made different between a central portion and a peripheral portion of a pattern.

(Patent Document 1)
Japanese Patent Application Laid-open No. Hei 10-90878
(Patent Document 2)
Japanese Patent Application Laid-open No. Hei 11-354423
(Patent Document 3)
Japanese Patent Application Laid-open No. 2001-267223
(Patent Document 4)
Japanese Patent Application Laid-open No. Hei 9-298145

SUMMARY OF THE INVENTION

An object of the present invention is to simplify correction of electron beam exposure data to thereby shorten the generation time of the electron beam exposure data and/or the exposure time.

According to one aspect of the present invention, there is provided a method for correcting electron beam exposure data, comprising: an input step of inputting electron beam exposure data identifiable for each type of pattern of a semiconductor device; and a correction step of correcting electron beam exposure data on a second type of pattern without correcting electron beam exposure data on a first type of pattern.

The first type of pattern is, for example, a dummy pattern having no influence on the function of the semiconductor device and a pattern not necessarily requiring correction. The second type of pattern is, for example, a normal pattern having an influence on the function of the semiconductor device and a pattern requiring correction. By dividing patterns into the first type of pattern not requiring correction and the second type of pattern requiring correction and correcting only the second type of pattern, the function of the semiconductor device can be maintained and the generation time of the electron beam exposure data and/or the exposure time can be shortened.

BRIEF DESCRIPTION OF THE DRAWINGS

FIG. 1 is a sectional view showing an example of a semiconductor device manufactured using electron beam exposure data generated by an embodiment of the present invention;

FIG. 5 is a flowchart showing electron beam exposure data processing according to the present embodiment;

FIG. 13 is a diagram showing a first etching correction processing example;

FIG. 15 is a diagram showing a third etching correction processing example;

FIG. 16 is a diagram showing shift processing of a pattern width;

FIG. 18 is a block diagram showing a hardware configuration example of a computer.

DETAILED DESCRIPTION OF THE PREFERRED EMBODIMENTS

Figure 2A:
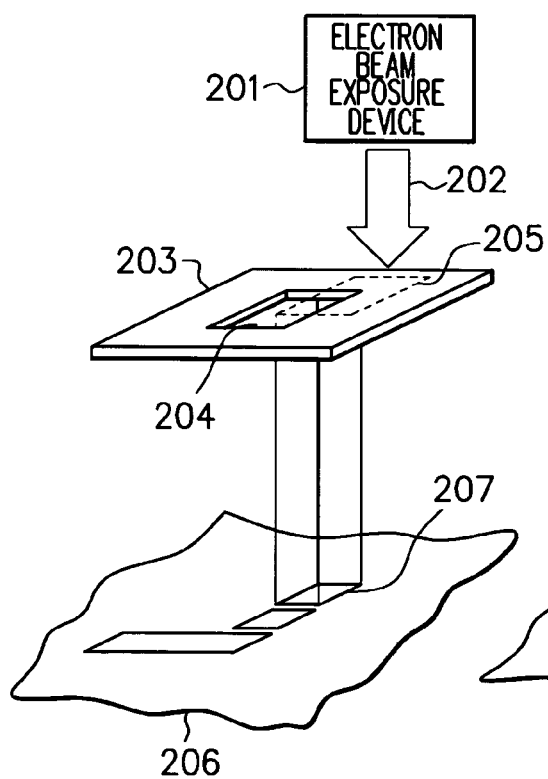
FIG. 2A is a view showing variable rectangular exposure.

FIG. 1 is a sectional view showing an example of a semiconductor device manufactured using electron beam exposure data generated by an embodiment of the present invention. The semiconductor device includes a first wiring layer 101, a via layer (insulating layer) 102, a second wiring layer 103, and so on, for example, on a silicon substrate. The first wiring layer 101 includes metal wiring patterns 111 and 112, for example, made of aluminum. The second wiring layer 103 includes metal wiring patterns 131 and 132, for example, made of aluminum. The via layer 102 includes via plugs 121 and 122 made of heavy metal such as tungsten. The above patterns are separated by an insulating material. The via plug 121 connects the wiring patterns 111 and 131. The via plug 122 connects the wiring patterns 111 and 132.

The wiring pattern 112 is a dummy pattern having no influence on the function of the semiconductor device. The other patterns 111, 121, 122, 131, and 132 are normal patterns having an influence on the function of the semiconductor device. If the dummy pattern 112 does not exist, its corresponding portion does not become flat, which causes an adverse effect such as a break in the wiring pattern 132 thereabove. The dummy pattern 112 is a pattern for planarizing the semiconductor device.

Manufacturing the semiconductor device includes steps of exposure, development, and etching. For example, a metal layer is formed on the silicon substrate, and a resist is applied thereon. If the resist is subjected to electron beam exposure in a predetermined pattern and development, the resist with the predetermined pattern remains. Thereafter, by etching the above metal layer with the above resist as a mask, a predetermined metal wiring pattern is generated.

As for the electron beam exposure, electron beam exposure data is generated based on design data on patterns of respective layers of the semiconductor device, and then the electron beam exposure is performed. The normal patterns 111, 113, and so on influence the function of the semiconductor device, so that high-precision alignment (positioning) is necessary. In contrast, the dummy pattern 112 does not influence the function of the semiconductor device, so that high-precision alignment is unnecessary. If the electron beam exposure data is generated with the normal patterns 111 and so on and the dummy pattern 112 both aligned highly precisely when the electron beam exposure data is generated, the generation time thereof and the exposure time become long. Since the dummy pattern 112 does not require high-precision alignment, in the present embodiment, by simplifying generation processing of electron beam exposure data on the dummy pattern 112, the generation time thereof and the exposure time can be shortened. The details thereof will be described below.

First, the electron beam exposure will be described. In a process of manufacturing the semiconductor device, exposure to transfer a pattern onto a resist applied to a semiconductor wafer is performed. The electron beam exposure enables finer pattern transfer than exposure using ultraviolet light, and it is being developed as a next-generation exposure method.

Figure 2B:
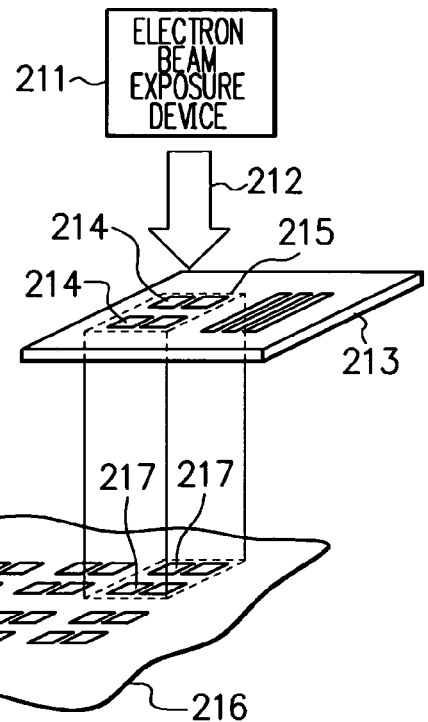
FIG. 2B is a view showing one-shot exposure.

FIG. 2A shows variable rectangular exposure, and FIG. 2B shows one-shot exposure. The electron beam exposure is performed by combining the variable rectangular exposure and the one-shot exposure depending on patterns.

In FIG. 2A, an electron beam exposure device irradiates an electron beam 202 onto a semiconductor wafer 206 via a mask 203 according to electron beam exposure data. The mask 203 has one opening 204. The electron beam 202 is irradiated to a region 205 on the mask 203, and the electron beam which has passed the opening 204 is irradiated to a region 207 on the semiconductor wafer 206. In the variable rectangular exposure, patterns are exposed one by one by a variable shaped electron beam.

In FIG. 2B, an electron beam exposure device 211 irradiates an electron beam 212 onto a semiconductor wafer 216 via a mask 213 according to electron beam exposure data. Plural openings 214 are provided in a block 215 of the mask 213. The electron beam 212 is irradiated to the block 215 on the mask 213, and the electron beam which has passed the plural openings 214 is irradiated to plural regions 217 on the semiconductor wafer 216. In the one-shot exposure, plural patterns are collectively exposed.

The exposure amount is set for an exposure pattern, energy according to the exposure amount is stored in the resist, and the pattern is developed in a portion with high energy. Namely, at the time of development, a portion with a large exposure amount is left, while a portion with a small exposure amount is removed. The stored energy is obtained from the sum of energy stored by forward scattering in which electrons gradually spread out when the electron beam is irradiated to the resist and energy stored by backscattering in which after passing the resist, the electron beam collides with a semiconductor substrate and reflects back again to the resist. Details will be described later with reference to FIG. 12B.

Next, electron beam exposure data processing will be described. The electron beam exposure data to be inputted to the electron beam exposure devices 201 and 211 are created from design data. The design data is constituted by a hierarchy of structures, for example, as shown in FIG. 3A and FIG. 3B.

Figure 3A:
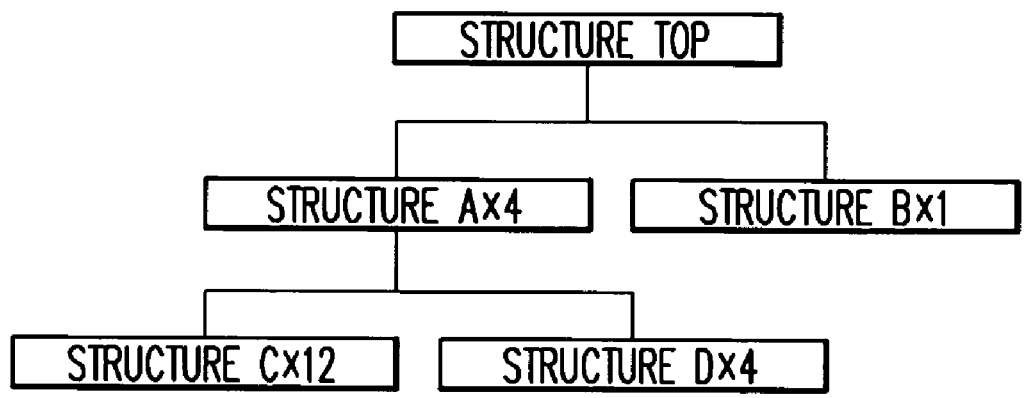
FIG. 3A is a hierarchy structure diagram of structures.
Figure 3B:
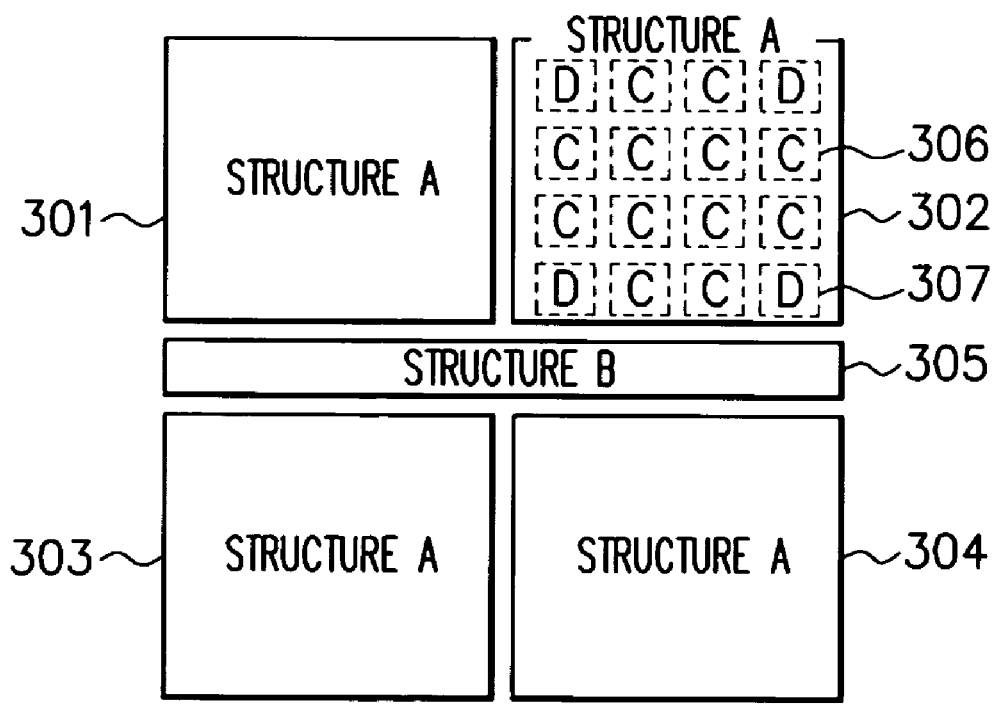
FIG. 3B is a structure arrangement diagram.

FIG. 3A is a hierarchy structure diagram of structures, and FIG. 3B is a structure arrangement diagram. Under a most significant structure TOP, four types of structures A, B, C, and D are arranged. More specifically, under the structure TOP, four structures A (301 to 304) and one structure B (305) are arranged. Each of the structures A (301 to 304) is composed of 12 structures C (306) and four structures D (307).

Figure 4:
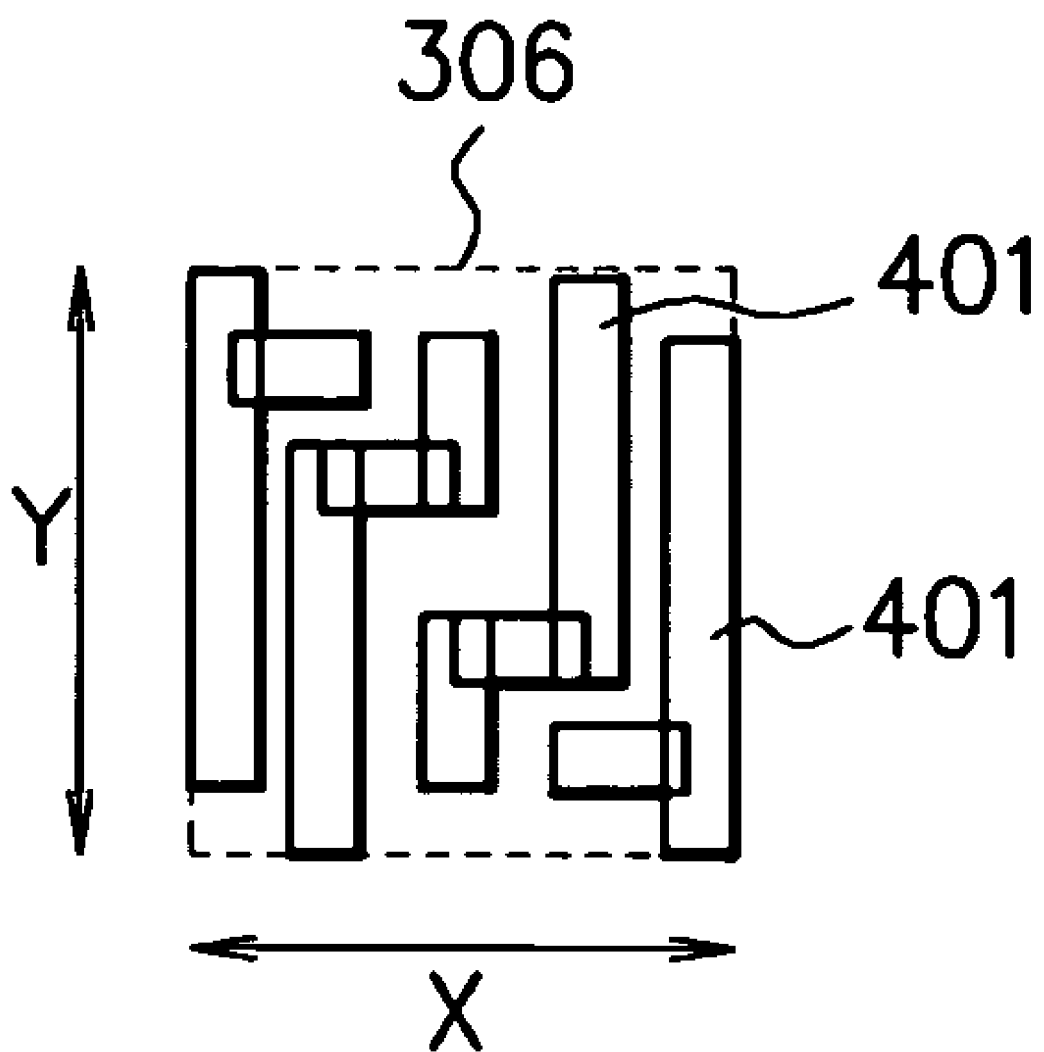
FIG. 4 is a diagram showing a configuration example of a structure.

FIG. 4 shows a configuration example of the structure C (306). The structure C (306) is composed of patterns 401 of respective layers, and each pattern is defined by a layer number. X and Y represent lateral and longitudinal region sizes of the structure C.

FIG. 5 is a flowchart showing electron beam exposure data processing according to the present embodiment. This processing is performed for each layer of the semiconductor device.

First, in step S501, design data 511 described above is inputted to perform graphical logic operation processing. In the graphical logic operation processing, logical sum (OR) processing, shift processing of the pattern width, and so on are performed on the design data 511 to remove overlapping of patterns.

In a control file to be inputted in the graphical logic operation processing, layer numbers by which the normal pattern and the dummy pattern are defined are described. With reference to the control file, the normal pattern and the dummy pattern are defined by different layer numbers, and data is outputted.

Then, in step S502, etching correction processing is performed. The etching correction processing is a correction in which a difference in etching speed depending on patterns is considered. The details thereof will be described later with reference to a flowchart in FIG. 6. Thereafter, intermediate data 512 is outputted. A format of the intermediate data 512 is the same as that of the design data 511.

Next, in step S503, exposure data format conversion processing is performed. In the exposure data format conversion processing, the intermediate data 512 is format converted, and exposure data 513 is outputted. Namely, the electron beam exposure data is format converted from that for design data to that for exposure data. The details of this processing will be described later with reference to FIG. 8.

Then, in step S504, proximity effect correction processing is performed, and exposure data 515 is outputted. In the proximity effect correction processing, based on plural exposure data on lower layers 514, a correction, in which the quantity of electrons reflected from layers below a resist when an electron beam is irradiated to the resist is considered, is performed. For example, when patterns in the second wiring layer 103 in FIG. 1 are exposed, the correction is performed in consideration of the quantity of electrons reflected (backscattered) from patterns in the via layer 102 and the first wiring layer 101 therebelow. A specific example thereof will be described below with reference to FIG. 12A and FIG. 12B.

Figure 12A:
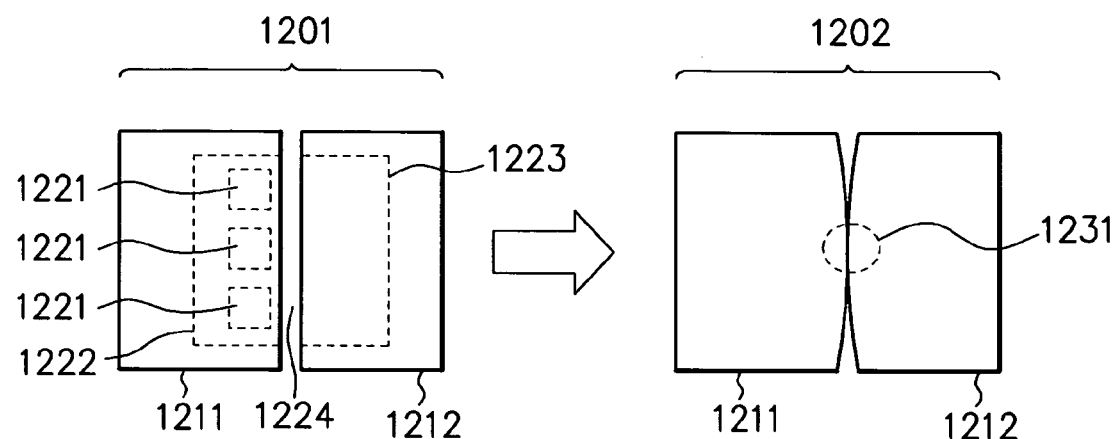
FIG. 12A and FIG. 12B are diagrams for explaining proximity effect correction processing.
Figure 12B:
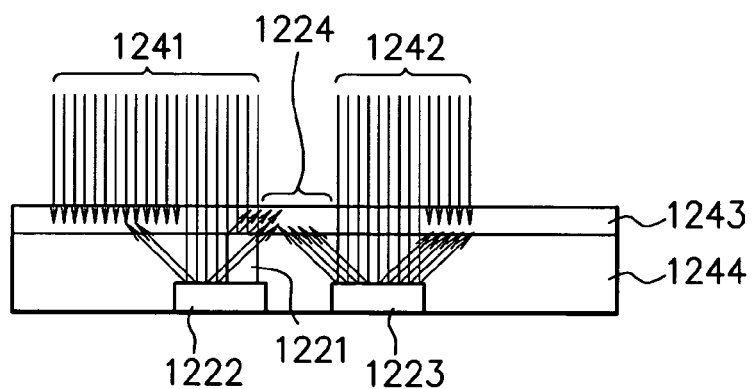

In FIG. 12A, a pattern 1201 is an electron beam exposure pattern. A pattern 1202 is a resist pattern after exposure and development are performed based on the electron beam exposure pattern 1201. FIG. 12B is a sectional view of a semiconductor device when the electron beam exposure pattern 1201 in FIG. 12A is exposed.

First, the electron beam exposure pattern 1201 will be described. The electron beam exposure pattern 1201 includes a first pattern 1211 and a second pattern 1212. A gap 1224 is a region with no pattern between the patterns 1211 and 1212. A pattern 1221 is a via plug pattern in the first layer below the layer of the first pattern 1211. A pattern 1222 is a wiring pattern in the second layer below the layer of the first pattern 1211. A pattern 1223 is a wiring pattern in the second layer below the layer of the second pattern 1212.

In FIG. 12B, a resist 1243 is a resist to form the patterns 1211 and 1212 in FIG. 12A. The via plug pattern 1221 is provided in a via layer as the first layer below the resist 1243. The wiring patterns 1222 and 1223 are provided in a wiring layer as the second layer below the resist 1243. They are covered with an insulating material 1244.

An electron beam 1241 is an electron beam which has passed a mask in order to form the pattern 1211 in FIG. 12A, and it is irradiated to the resist 1243, and simultaneously after passing the resist 1243, it is reflected by the patterns 1221 and 1222, back-scattered, and irradiated to the resist 1243. An electron beam 1242 is an electron beam which has passed a mask in order to form the pattern 1212 in FIG. 12A, and it is irradiated to the resist 1243, and simultaneously after passing the resist 1243, it is reflected by the pattern 1223, back-scattered, and irradiated to the resist 1243.

As a result of the above backscattering, a large quantity of electrons are irradiated to the region of the gap 1224 out of the resist 1243, and this portion remains after development. As a result, in the resist pattern 1202 in FIG. 12A, the patterns 1211 and 1212 get into touch with each other by an enlargement of their sizes, and the patterns 1211 and 1212 are short-circuited in a region 1231.

Hence, it is necessary to determine the exposure amount of the pattern in consideration of backscattering in which electrons which have collided with layers (for example, a via plug (including a contact plug), a wiring pattern, and so on) below the resist 1243 are reflected. Namely, to calculate stored energy by backscattering, information on patterns of lower layers (number of patterns, pattern sizes, arrangement positions of patterns, and so on) and correction parameters (backscattering coefficients) with respect to the patterns are referred to.

Next, processing examples of the proximity effect correction processing will be shown. Incidentally, exposure data on lower layers are created by the same processing (FIG. 5) as the layer to be processed.

First, a first processing example of a proximity effect correction will be described. Exposure data on the lower layers and a control file in which backscattering coefficients with respect to the exposure data are described are inputted. For example, exposure data on three layers from the nearest layer to the resist are inputted, and the following backscattering coefficients are described in the control file.

backscattering coefficient with respect to the first layer below the resist=1.2 backscattering coefficient with respect to the second layer below the resist=1.0 backscattering coefficient with respect to the third layer below the resist=0.8

More specifically, the stored energy is calculated, and the exposure amount is set so that the pattern size after development becomes the same as the pattern size of the design data. The stored energy is calculated mainly by pattern density and the quantity of electrons reflected by the resist, and the backscattering coefficient is defined as the coefficient representing the quantity of electrons. In a region with a higher pattern density, the stored energy by backscattering becomes larger. Conversely, in a region with a lower pattern density, the stored energy becomes smaller. If the backscattering coefficient is large, the quantity of reflected electrons is large. Conversely, if the backscattering coefficient is small, the quantity of reflected electrons is small. The backscattering coefficient is determined according to the number of layers below the resist and patterns in the layers, and the proximity effect correction is performed.

Figure 6:
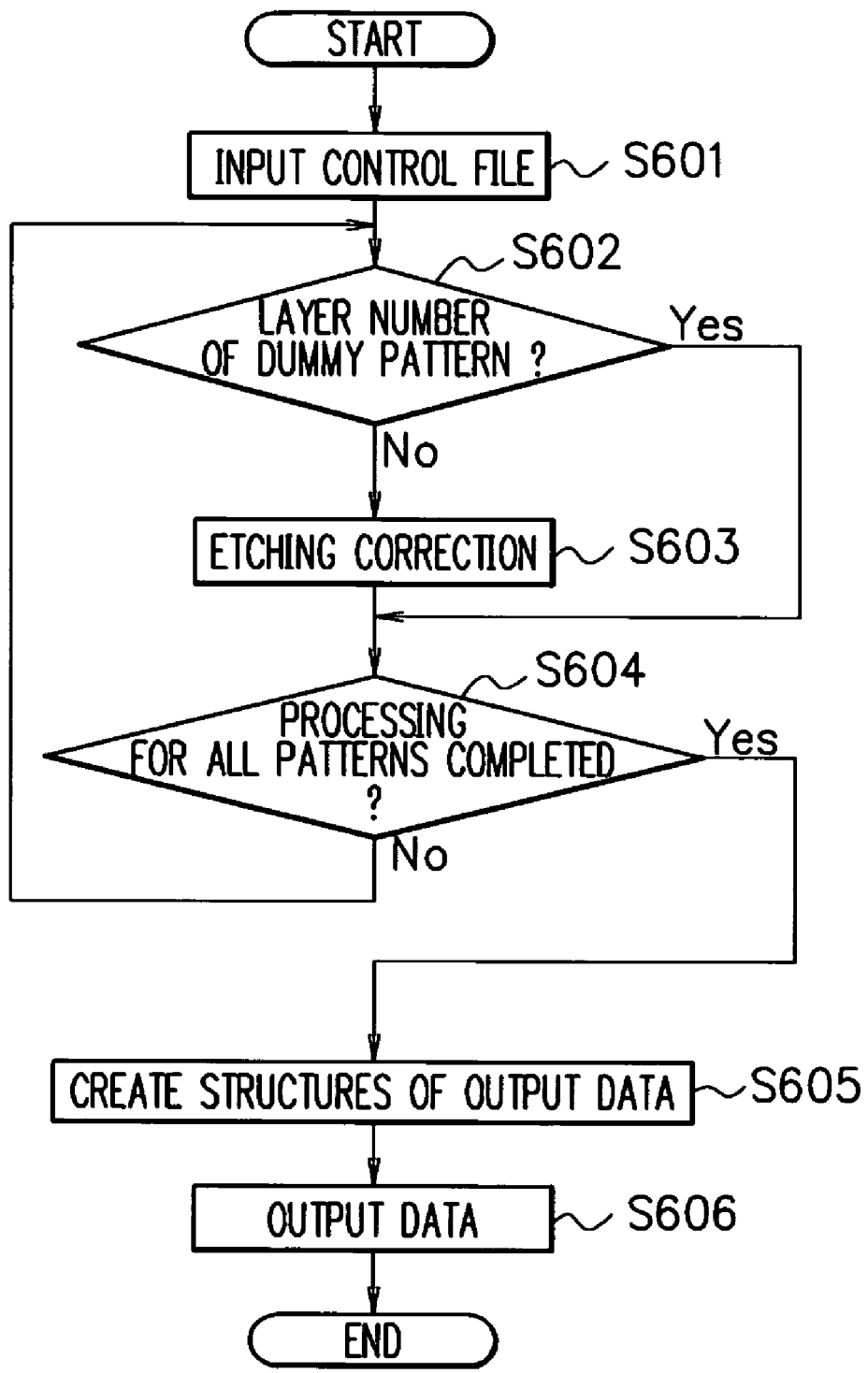
FIG. 6 is a flowchart showing the details of etching correction processing.

Next, a second processing example of the proximity effect correction will be described. Exposure data on lower layers are inputted. When the exposure data is created, the pattern width is shifted in the graphical logic operation processing in step S501 in FIG. 5. For example, if a pattern 1601 is shifted by −1 μm as shown in FIG. 16, a pattern 1602 is obtained. If the pattern width is increased after exposure and development, the pattern width is shifted in a minus direction. For example, exposure data on three layers from the nearest layer to the resist are inputted, and pattern shift is performed by a size which is different according to each lower layer. The shift size for each lower layer will be shown below. The shift size of the pattern width is determined according to the number of layers below the resist and patterns in the layers, and the proximity effect correction is performed by shifting by the shift size.

shift size with respect to the first layer below the resist=−0.01 μm shift size with respect to the second layer below the resist=−0.03 μm shift size with respect to the third layer below the resist=−0.05 μm FIG. 6 is a flowchart showing the details of the etching correction processing in step S502 in FIG. 5.

First, in step S601, a control file is inputted. In the control file, the layer numbers by which the normal pattern and the dummy pattern are defined are described. The dummy pattern is a pattern having no influence on the function of the semiconductor device, and the normal pattern is a pattern having an influence on the function of the semiconductor device.

Then, in step S602, with reference to the layer numbers of the control file, it is checked whether an object to be processed is the dummy pattern or the normal pattern. If it is the normal pattern, the processing advances to step S603, and if it is the dummy pattern, the processing advances to step S604 without performing the etching correction processing (S603).

In step S603, the etching correction processing is performed. The details thereof will be described later with reference to FIG. 13 to FIG. 15. Then, the processing advances to step S604.

In step S604, it is checked whether processing for all patterns is completed. If it is completed, the processing advances to step S605, and if not, the processing returns to step S602, and the processing for the next pattern is performed.

Figure 7:
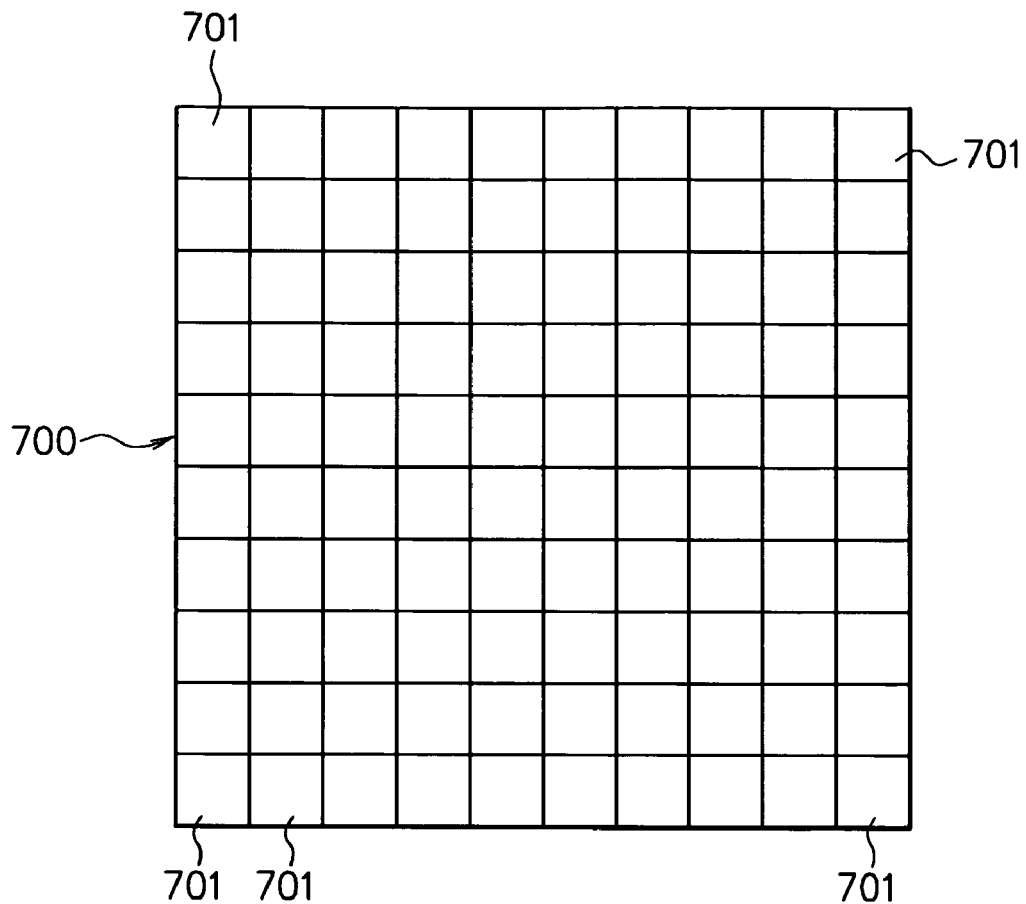
FIG. 7 is a diagram for explaining structure creation processing.

In step S605, structures of output data are created. As shown in FIG. 7, the structures are created by dividing the entire region of data 700 into units of small processing regions 701. The processing region 701 has a region size described in the control file, and the first three letters of a structure name are taken, for example, as "ABC". For example, the structure name of a first processing region 701 is taken as "ABC_1", the structure name of a second processing region 701 is taken as "ABC_2", and so on. All of the divided processing regions 701 have the same shape. The detailed thereof will be described later.

Then, in step S606, the intermediate data is outputted.

As described above, since the dummy pattern has no influence on the function of the semiconductor device, the electron beam exposure data generation time and the exposure time can be shortened by eliminating the unnecessary etching correction processing (S603).

Figure 11:
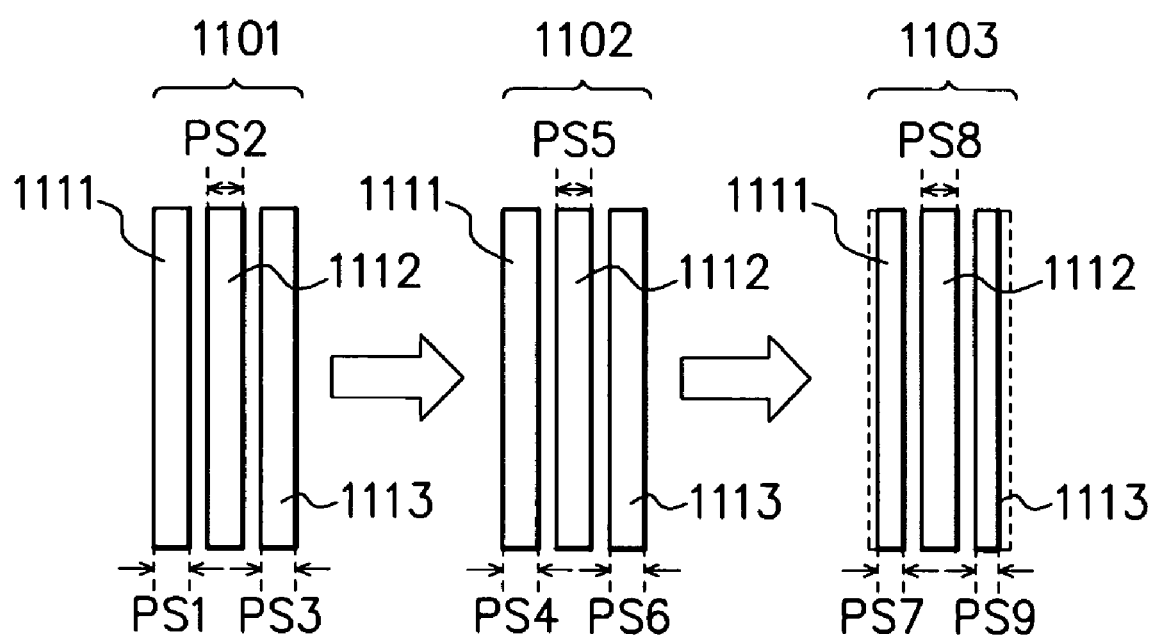
FIG. 11 is a diagram for explaining the etching correction processing.

FIG. 11 is a diagram for explaining the etching correction processing. A pattern 1101 is a design data pattern. A pattern 1102 is a resist pattern after exposure and development are performed based on the design data pattern 1101. A pattern 1103 is a metal wiring pattern obtained by etching with the resist pattern 1102 as a mask.

The design data pattern 1101 includes a first pattern 1111, a second pattern 1112, and a third pattern 1113. If the proximity effect correction processing is performed, no distortion occurs in the shape of the pattern 1102 after exposure and development.

In the pattern 1101 before exposure and development, the width of the pattern 1111 is taken as PS1, the width of the pattern 1112 is taken as PS2, and the width of the pattern 1113 is taken as PS3. In the pattern 1102 after exposure and development, the width of the pattern 1111 is taken as PS4, the width of the pattern 1112 is taken as PS5, and the width of the pattern 1113 is taken as PS6. At this time, the widths PS1 and PS4 are the same, the widths PS2 and PS5 are the same, and the widths PS3 and PS6 are the same.

However, since other patterns are not arranged on the left side of the pattern 1111 and the right side of the pattern 1113, gas or chemical tends to enter thereinto at the time of etching, so that etching further progresses. Therefore, in the pattern 1103 after etching, the pattern width becomes smaller than the width of the design data pattern 1101.

In the pattern 1103 after etching, the width of the pattern 1111 is taken as PS7, the width of the pattern 1112 is taken as PS8, and the width of the pattern 1113 is taken as PS9. At this time, the width PS7 is smaller than PS4, the width PS9 is smaller than PS6, and the width PS8 is the same as PS5.

The size of the pattern 1103 after etching becomes different from the size of the design data pattern 1101. By this phenomenon, the pattern size after etching becomes out of the range of a predetermined standard value, so that the semiconductor device cannot demonstrate the assumed capability. Hence, it is necessary to perform the etching correction processing.

Next, the etching correction processing shown in step S603 in FIG. 6 will be described.

FIG. 13 shows a first etching correction processing example.

A pattern 1301 is a design data pattern and includes patterns 1311, 1312, and 1313. The width of the pattern 1311 is PS10, the width of the pattern 1312 is PS11, and the width of the pattern 1313 is PS12.

A pattern 1302 is a pattern obtained by subjecting the design data pattern 1301 to an etching correction. The width of the pattern 1311 is PS13, the width of the pattern 1312 is PS14, and the width of the pattern 1313 is PS15. Since etching further progresses on the left side of the pattern 1311 and the right side of the pattern 1313, the pattern width of the pattern 1313 is extended to the left side while the width of the pattern 1313 is extended to the right side. The width P13 is larger than the width PS10 and obtained by correcting the width PS10 to PS10+EX1. The width PS14 is the same as the width PS11. The width PS15 is larger than the width PS12 and obtained by correcting the width P12 to PS12+EX1.

A pattern 1303 is a resist pattern after exposure and development based on the pattern 1302. The width of the pattern 1311 is PS16, the width of the pattern 1312 is PS17, and the width of the pattern 1313 is PS18. The width PS16 is the same as the width PS13, the width PS17 is the same as the width PS14, and the width PS18 is the same as the width PS15.

A pattern 1304 is a metal wiring pattern obtained by etching with the resist pattern 1303 as a mask. The width of the pattern 1311 is PS19, the width of the pattern 1312 is PS20, and the width of the pattern 1313 is PS21. Etching tends to progress further on the left side of the pattern 1311 and the right side of the pattern 1313. As a result, the width PS19 becomes smaller than the width PS16 and the same as the width PS10. The width PS20 is the same as the width PS17. The width PS21 becomes smaller the width PS18 and the same as the width PS12.

Figure 14:
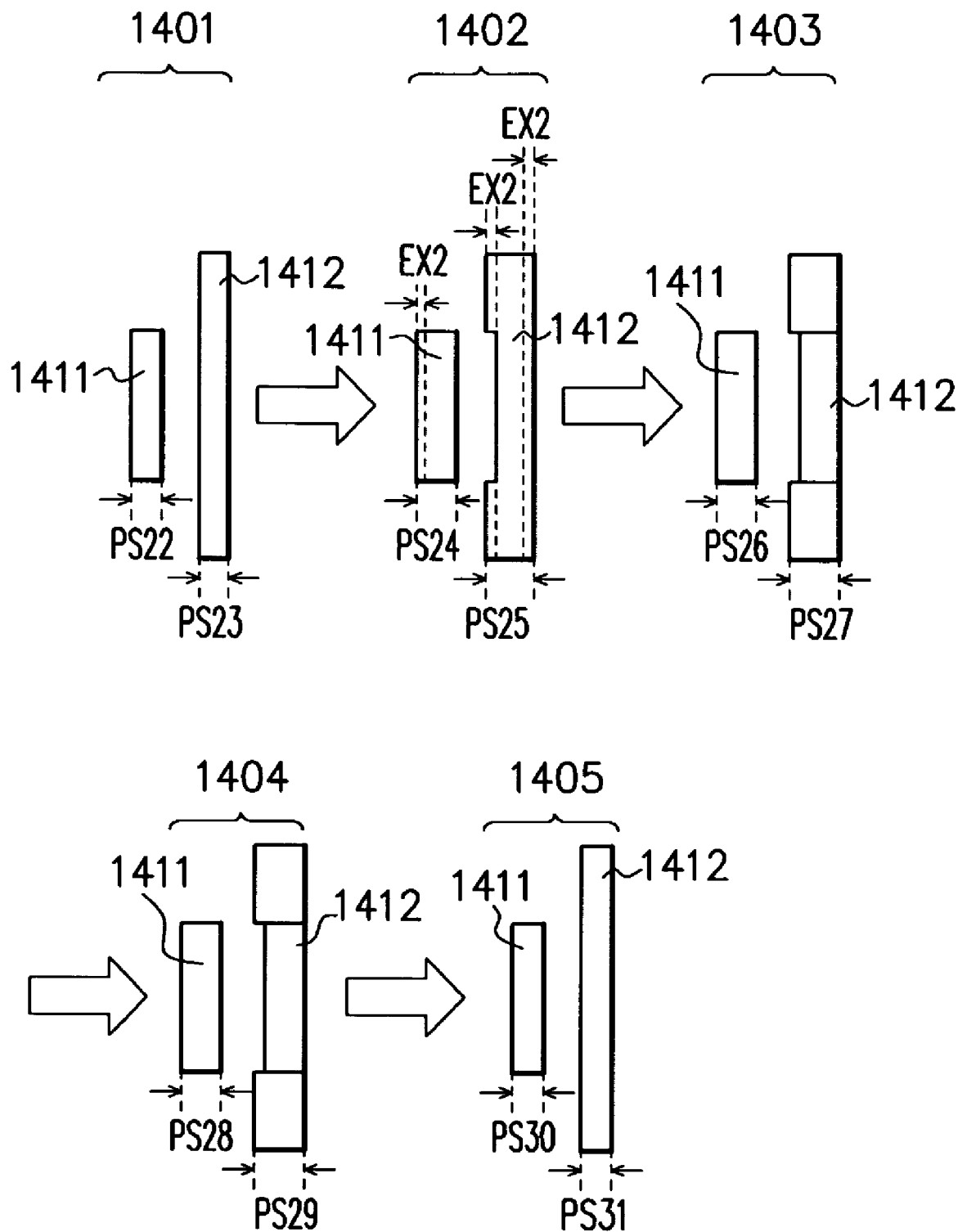
FIG. 14 is a diagram showing a second etching correction processing example.

FIG. 14 is a second etching correction processing example.

A pattern 1401 is a design data pattern and includes patterns 1411 and 1412. The width of the pattern 1411 is PS22 and the width of the pattern 1412 is PS23.

A pattern 1402 is a pattern obtained by subjecting the design data pattern 1401 to the etching correction. The pattern width of the pattern 1411 is extended by EX2 to the left side, while the pattern width of the pattern 1412 is extended by EX2 to the right side. Also on the left side of the pattern 1412, except for a portion facing the pattern 1411, the pattern width thereof is extended by EX2 to the left side. A width PS24 of the pattern 1411 is PS22+EX2. A width PS25 obtained by correcting the pattern 1412 is PS23+EX2+EX2.

A pattern 1403 is a pattern after the pattern 1402 is format-converted into exposure data. On the left side of the pattern 1412, difference in level occurs, so that the pattern 1412 is divided into three patterns by the exposure data format conversion processing (step S503 in FIG. 5). A width PS26 of the pattern 1411 is the same as the width PS24. A width PS27 of the pattern 1412 is the same as the width PS25.

A pattern 1404 is a resist pattern after exposure and development based on the pattern 1403. A width PS28 of the pattern 1411 is the same as the width PS26. A width PS29 of the pattern 1412 is the same as the width PS27.

A pattern 1405 is a metal wiring pattern obtained by etching with the resist pattern 1404 as a mask. A width PS30 of the pattern 1411 is the same as the width PS22, and a width PS31 of the pattern 1412 is the same as the width PS23.

FIG. 15 is a third etching correction processing example.

A pattern 1501 is a design data pattern and includes patterns 1511 and 1512. The width of the pattern 1511 is PS32 and the width of the pattern 1512 is PS33. The distance between the patterns 1511 and 1512 is D1.

A pattern 1502 is a pattern obtained by subjecting the design data pattern 1501 to the etching correction. The pattern widths of the pattern 1511 and the pattern 1512 are extended by EX3 to the left side and to the right side, respectively, for the same reason as in FIG. 13 and FIG. 14. Depending on an etching condition (such as the type of the gas or chemical to be used), the size of the distance D1 between the pattern 1511 and 1512 is referred to, and if it is a given threshold vale or more, the pattern widths of the pattern 1511 and the pattern 1512 are extended by EX4 to the right side and to the left side, respectively. A width PS34 of the pattern 1511 is PS32+EX3+EX4. A width PS35 of the pattern 1512 is PS33+EX3+EX4.

A pattern 1503 is a resist pattern after exposure and development based on the pattern 1502. A width PS36 of the pattern 1511 is the same as the width PS34. A width PS37 of the pattern 1512 is the same as the width PS35.

A pattern 1504 is a metal wiring pattern obtained by etching with the resist pattern 1503 as a mask. A width PS38 of the pattern 1511 is the same as the width PS32, and a width PS39 of the pattern 1512 is the same as the width PS33. A distance D2 between the patterns 1511 and 1512 is the same as the distance D1.

In FIG. 13 to FIG. 15, the sizes (EX1, EX2, EX3, EX4) by which the pattern width is extended and the threshold value are described in the control file to be inputted in the etching correction processing, and the etching correction processing is performed with reference to this control file.

Namely, the etching correction processing is performed before the exposure data format conversion to prevent a phenomenon in which the pattern size after etching differs from the pattern size of the design data. In the etching correction processing, the pattern width is made larger in advance in a region where etching further progresses.

Moreover, in some cases, the pattern is divided by the exposure data format conversion processing as shown in FIG. 14, so that not only the number of patterns but also the exposure time is increased. According to the present embodiment, as shown in FIG. 6, the dummy pattern is not subjected to the etching correction processing, which can shorten the electron beam exposure data generation time and the exposure time.

In the exposure data format conversion processing in step S503 in FIG. 5, the hierarchical processing of processing each of repeatedly arranged structures (for example, the structures A and the structure B in FIG. 3B) is performed, but even in the case of the same structure, depending on the arrangement position, the result of the etching correction differs, and the number of repeatedly arranged structures reduces. Consequently, the exposure data format conversion processing time increases.

In the present embodiment, the exposure data format conversion processing time can be shortened by the structure creation processing in step S605 in FIG. 6. As shown in FIG. 7, the size (for example, an X-axis value and a Y-axis value) of the structure region 701 is described in the control file to be inputted in the etching correction processing, and the most significant structure and the other less significant ones are divided in a grid of squares each having the size of the structure region 701. Data is outputted with the divided region 701 as one type of structure. In the exposure data format conversion processing, the exposure data format conversion processing is performed for each structure region 701. In a control file to be inputted in the exposure data format conversion processing, names of divided structures with the size of the region 701 are described. The first three letters (for example, "ABC") of the name of the structure outputted in the etching correction processing are described in the control file to be inputted, and the exposure data format conversion processing is performed for each structure region 701 having the first three letters.

For example, if all the patterns of the most significant structure and the other less significant ones are collectively converted, the processing time increases due to an increase in the number of times of access to a magnetic disk (for example, an external storage unit 1808 in FIG. 18). Hence, if the conversion is performed for each certain number of patterns of the structure region 701 whose arrangement coordinates, number of vertexes, and so on can be collectively put on a memory (for example, a RAM 1804 in FIG. 18), the number of times of access decreases, which can reduce the processing time.

The size of the structure region 701 can be specified by a different size on a layer-by-layer basis. For example, in the case of wiring layers, the wiring layers can be broadly classified into a layer in which most of patterns extend in a longitudinal direction and a layer in which most of patterns extend in a lateral direction. By specifying the structure size including the whole pattern without dividing the pattern wherever possible, the structure region 701 becomes longitudinally long in the layer in which most of patterns extend in the longitudinal direction, while the structure region 701 becomes laterally long in the layer in which most of patterns extend in the lateral direction. If the pattern is divided, the number of patterns correspondingly increases, and consequently the processing time increases.

Figure 8:
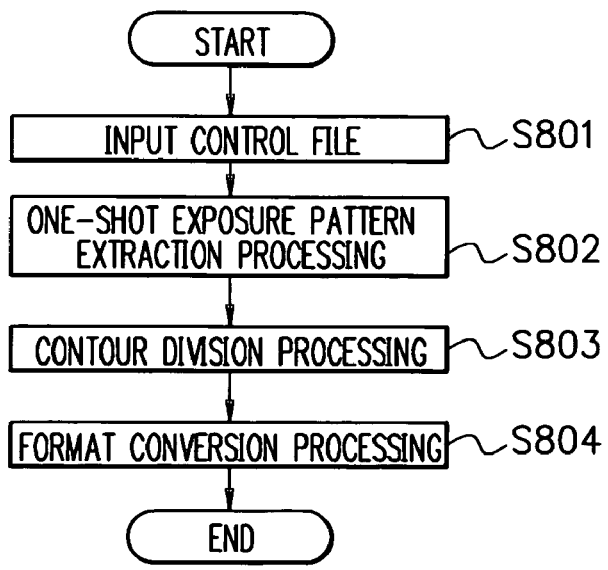
FIG. 8 is a flowchart showing the details of exposure data format conversion processing.

FIG. 8 is a flowchart showing the details of the exposure data format conversion processing in step S503 in FIG. 5.

First, in step S801, the control file is inputted. In the control file, the layer numbers by which the normal pattern and the dummy pattern are defined respectively are described.

Then, in step S802, one-shot exposure pattern extraction processing is performed. Namely, out of patterns arranged in a structure described in the control file, variable rectangular exposure patterns in FIG. 2A and one-shot exposure patterns in FIG. 2B are separated and extracted. More specifically, the variable rectangular exposure patterns are selected from the variable rectangular exposure patterns and the one-shot exposure patterns.

Next, in step S803, contour division processing is performed only on the variable rectangular exposure patterns. The details thereof will be described later with reference to FIG. 9.

Then, in step S804, in conformity with the format, the intermediate data 512 in FIG. 5 is converted to the exposure data 513 and outputted.

The above steps S802 and S803 are performed for each of the structures described in the control file.

Figure 9:
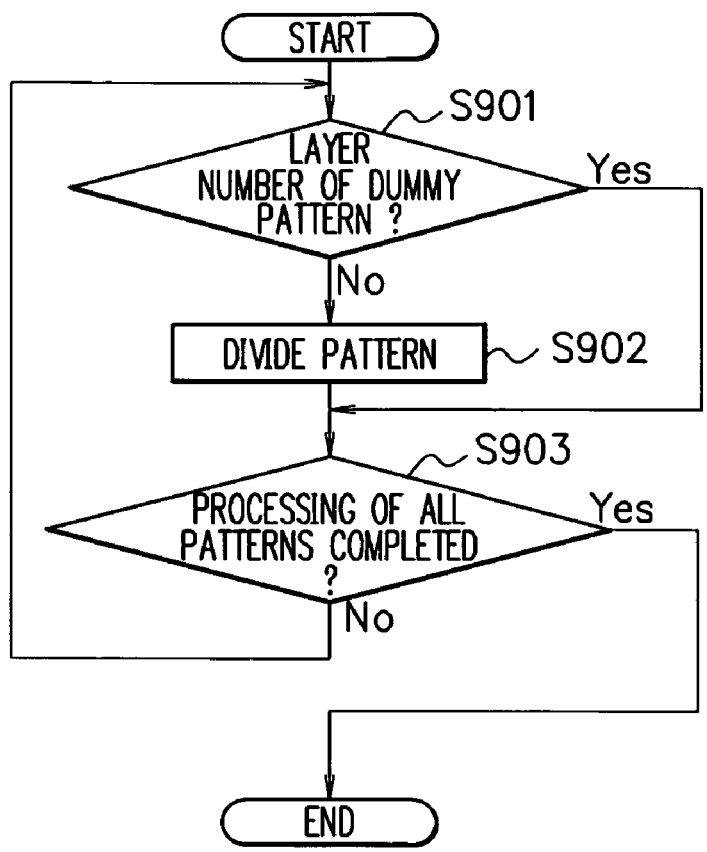
FIG. 9 is a flowchart showing the details of contour division processing.

FIG. 9 is a flowchart showing the details of the contour division processing in step S803 in FIG. 8.

First, in step S901, it is checked whether the pattern is the dummy pattern with reference to the layer numbers in the control file. In the control file, the layer numbers by which the normal pattern and the dummy pattern are defined respectively are described. If it is the normal pattern, the processing advances to step S902, and if it is the dummy pattern, the processing advances to step S903 without performing pattern division (S902).

In step S902, pattern division processing is performed. The details of this processing will be described later with reference to FIG. 10. Thereafter, the processing advances to step S903.

In step S903, it is checked whether processing for all patterns is completed. If it is completed, the processing ends, and if not, the processing returns to step S901, and the processing for the next pattern is performed.

Figure 10:
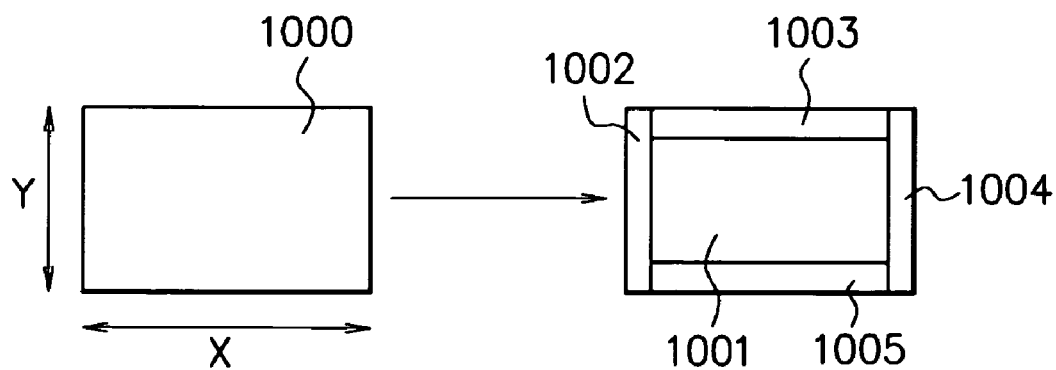
FIG. 10 is a diagram for explaining pattern division processing.

FIG. 10 is a diagram for explaining the pattern division processing in step S902 in FIG. 9. In the pattern division processing, one pattern 1000 is divided into five patterns 1001, 1002, 1003, 1004, and 1005. More specifically, it is divided into the center portion 1001 and its contour portions 1002, 1003, 1004, and 1005. After the pattern division, in the proximity effect correction processing in step S504 in FIG. 5, distortion in pattern shape due to the proximity effect is avoided by making the exposure amount in the center portion 1001 smaller and making the exposure amount in the contour portions 1002 to 1005 larger. Namely, in the proximity effect correction processing, the electron beam exposure amounts in the center portion 1001 and the contour portions 1002 to 1005 are made different. As just described, the contour division processing can be said to be part of the proximity effect correction processing.

As described above, in the exposure data format conversion processing, the contour division (pattern division) processing is not performed on the dummy pattern. Since in the contour division processing, the pattern is divided and different exposure amounts are set, the number of patterns increases and the exposure time becomes longer. In the present embodiment, the contour division (pattern division) processing is not performed on the dummy pattern, so that the electron beam exposure data generation time and the exposure time can be shortened.

Figure 17:
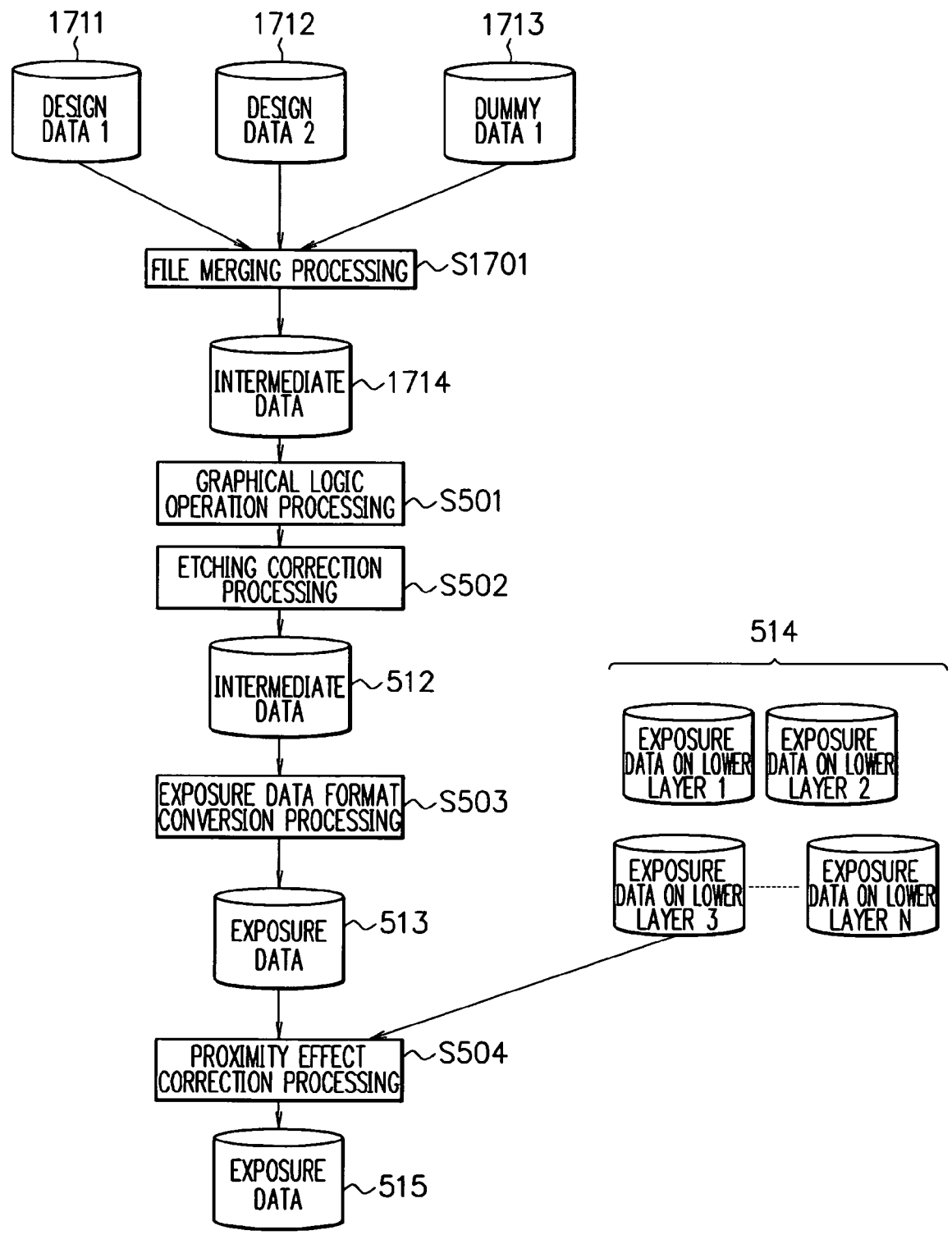
FIG. 17 is a flowchart showing another electron beam exposure data processing.

FIG. 17 is a flowchart showing another example of the electron beam exposure data processing in FIG. 5. In FIG. 5, the normal pattern and the dummy pattern are included in the design data 511. In FIG. 17, design data (normal data) 1711 and 1712 and dummy data 1713 are stored in different files. The design data 1711 is a normal pattern of a first functional block (for example, a ROM), the design data 1712 is a normal pattern of a second functional block (for example, an SRAM), and they are formed in one semiconductor device.

In step S1701, file merging processing is performed. In the file merging processing, files of the design data 1711 and 1712 and the dummy data 1713 are merged, and intermediate data 1714 is recorded in one file. After this, the same processing as in FIG. 5 is performed on the intermediate data 1714.

In a control file to be inputted in the file merging processing (S1701), layer numbers of the design data 1711 and 1712 and the dummy data 1713 and layer numbers of output data are described. As the layer numbers of the output data, different layer numbers for the normal pattern and the dummy pattern are described. By the file merging processing, the normal pattern and the dummy pattern are defined by output layer numbers with reference to the control file, and the intermediate data 1714 is outputted.

When files of two or more types of design data 1711 and 1712 are merged, or in order to planarize the surface of a wafer in a wafer process, the dummy pattern having no influence on the function of the semiconductor device can be merged.

FIG. 18 is a block diagram showing a hardware configuration example of a computer which performs the processings in FIG. 5 and FIG. 17. This computer can also create design data by CAD. A central processing unit (CPU) 1802, a ROM 1803, a RAM 1804, a network interface 1805, an input unit 1806, an output unit 1807, and an external storage unit 1808 are connected to a bus 1801.

The CPU 1802 is to perform data processing and an operation and control the above component units connected via the bus 1801. In the ROM 1803, a boot program is stored in advance, and the computer is booted up by the CPU 1802 executing this boot program. A computer program is stored in the external storage unit 1808, and the computer program is copied to the RAM 1804 and executed by the CPU 1802. This computer performs the processings in FIG. 5 and FIG. 17 and so on by executing the computer program.

The external storage unit 1808 is, for example, a hard disk storage unit or the like, and the storage content is not erased even if the power is turned off. The external storage unit 1808 can record the computer program, the design data, the intermediate data, the exposure data, the control files, and so on a recording medium and read the computer program and so on from the recording medium.

The network interface 1805 can input/output the computer program, the exposure data, and so on to/from a network. The input unit 1806 is, for example, a keyboard, a pointing device (mouse), or the like and can perform various specifications, input, or the like. The output unit 1807 is a display, a printer, or the like.

The present embodiment can be realized by the computer executing the program. A means for supplying the program to the computer, for example, a computer-readable recording medium such as a CD-ROM on which this program is recorded or a transmission medium such as the Internet which transmits the program can be used as an embodiment of the present invention. Further, a computer program product such as a computer readable recording medium on which the above program is recorded can be used as an embodiment of the present invention. The above program, recording medium, transmission medium, and computer program product are included in the category of the present invention. As the recording medium, for example, a flexible disk, a hard disk, an optical disk, a magnet-optical disk, a CD-ROM, a magnetic tape, a nonvolatile memory card, a ROM, or the like can be used.

As described above, according to the present embodiment, electron beam exposure data on a first type of pattern (dummy pattern) is not corrected, while electron beam exposure data on a second type of pattern (normal pattern) is corrected. The dummy pattern has no influence on the function of the semiconductor device, so that the electron beam exposure data generation time and the exposure time can be shortened by eliminating unnecessary processing.

By performing the etching correction processing in step S502 in FIG. 5, it becomes possible to keep the pattern size after etching within the range of the standard value. As a result, the yield of the semiconductor device increases, and thereby the cost can be reduced.

Moreover, as shown in FIG. 7, in the exposure data format conversion processing (S503 in FIG. 5) after the etching correction processing, by performing the exposure data format conversion processing for each structure created with the size of the region 701 specified on a layer-by-layer basis, the number of times of access to the magnetic disk can be reduced, thereby resulting in a reduction in the exposure data format conversion processing time.

Further, as shown in FIG. 6, in the etching correction processing, the dummy pattern is not corrected, which enables a reduction in the etching correction processing time and a reduction in the exposure time as well as the number of patterns.

Furthermore, as shown in FIG. 9, in the contour division processing, the contour division processing (proximity effect correction processing) of the dummy pattern is not performed, which enables a reduction in the exposure time as well as the number of patterns of the exposure data.

Besides, in the proximity effect correction processing, the exposure amount of a pattern is determined by calculating stored energy by back scattering from lower layers, and therefore the pattern size after development becomes the same as the pattern size of the design data. Consequently, the yield of the semiconductor device improves, and the cost can be reduced.

It is to be understood that the present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

INDUSTRIAL APPLICABILITY

A first type of pattern is, for example, a dummy pattern having no influence on the function of a semiconductor device and a pattern not necessarily requiring correction. A second type of pattern is, for example, a normal pattern having an influence on the function of the semiconductor device and a pattern requiring correction. By dividing patterns into the first type of pattern not requiring correction and the second type of pattern requiring correction and correcting only the second type of pattern, the function of the semiconductor device can be maintained and the generation time of electron beam exposure data and/or the exposure time can be shortened.

What is claimed is:

1. A method for correcting electron beam exposure data, comprising:
   inputting electron beam exposure data identifiable for each type of pattern of a semiconductor device, wherein:
      a first type of pattern is a dummy pattern used for planarization of a surface of the semiconductor device but having no influence on a function of the semiconductor device, and
      a second type of pattern is a normal pattern having an influence on a function of the semiconductor device; and
   correcting electron beam exposure data only on the second type of pattern without correcting electron beam exposure data on the first type of pattern;
   wherein, in the correcting the electron beam exposure data on the second type of pattern, a proximity effect correction is performed; and
   in the proximity effect correction, electron beam exposure data for a variable rectangular exposure is selected from the electron beam exposure data for the variable rectangular exposure and electron beam exposure data for a one-shot exposure, and only regarding the electron beam exposure data for the variable rectangular exposure, a center portion and contour portions of the pattern of the electron beam exposure data are divided, and second exposure amounts of the contour portions are made larger than first exposure amounts of the contour portions in the electron beam exposure amounts, and said dummy pattern is not divided.

2. The method for correcting the electron beam exposure data according to claim 1, wherein the first type of pattern is a dummy pattern in a metal wiring layer.

3. The method for correcting the electron beam exposure data according to claim 1, wherein in said correcting the electron beam exposure data on the second type of pattern, an etching correction is performed.

4. The method for correcting the electron beam exposure data according to claim 3, wherein the etching correction is a correction in which a difference in etching speed, depending on patterns, is performed.

5. The method for correcting the electron beam exposure data according to claim 1, wherein the proximity effect correction is a correction in which a quantity of electrons reflected from a layer of a resist when an electron beam is irradiated onto the resist is accounted for.

6. The method for correcting the electron beam exposure data according to claim 5, wherein the proximity effect correction is a correction in which a quantity of electrons reflected from a wiring pattern below the resist is accounted for.

7. The method for correcting the electron beam exposure data according to claim 5, wherein the proximity effect correction is a correction in which a quantity of electrons reflected from a via plug below the resist is accounted for.

8. The method for correcting the electron beam exposure data according to claim 5, wherein in the proximity effect correction, a backscattering coefficient is determined according to a number of layers below the resist and patterns in the layers to perform the correction.

9. The method for correcting the electron beam exposure data according to claim 5, wherein in the proximity effect correction, a pattern width is determined according to a number of layers below the resist and patterns in the layers to perform the correction.

10. The method for correcting the electron beam exposure data according to claim 1, wherein in said correcting the electron beam exposure data on the second type of pattern, an etching correction and a proximity effect correction are performed.

11. The method for correcting the electron beam exposure data according to claim 10, wherein said correcting the electron beam exposure data on the second type of pattern comprises:
   performing the etching correction on electron beam exposure data based on design data on the semiconductor device;
   converting the electron beam exposure data on which the etching correction is performed from that for the design data to that for exposure data; and
   performing the proximity effect correction on the converted electron beam exposure data.

12. The method for correcting the electron beam exposure data according to claim 10, wherein said correcting the electron beam exposure data on the second type of pattern comprises:
   subjecting electron beam exposure data to the etching correction;
   dividing the electron beam exposure data subjected to the etching correction into units of processing regions; and
   subjecting the exposure beam data to the proximity effect correction in each of the processing regions.

13. The method for correcting the electron beam exposure data according to claim 12, wherein the divided processing regions are of the same shape.

14. An electron beam exposure data correcting device, comprising:
   an input unit inputting electron beam exposure data identifiable for each type of pattern of a semiconductor device, wherein:
      the first type of pattern is a dummy pattern maintaining a planar surface but having no influence on a function of the semiconductor device, and
      the second type of pattern is a normal pattern having an influence on the function of the semiconductor device; and
   a correction unit correcting electron beam exposure data on a second type of pattern without correcting electron beam exposure data on a first type of pattern;
   wherein, in the correcting the electron beam exposure data on the second type of pattern, a proximity effect correction is performed; and
   in the proximity effect correction, electron beam exposure data for a variable rectangular exposure is selected from the electron beam exposure data for the variable rectangular exposure and electron beam exposure data for a one-shot exposure, and only regarding the electron beam exposure data for the variable rectangular exposure, a center portion and contour portions of the pattern of the electron beam exposure data are divided, and second exposure amounts of the contour portions are made larger than first exposure amounts of the contour portions in the electron beam exposure amounts, and said dummy pattern is not divided.

15. A program product for causing a computer to execute:

inputting electron beam exposure data identifiable for each type of pattern of a semiconductor device, wherein:

the first type of pattern is a dummy pattern maintaining a planar surface but having no influence on a function of the semiconductor device, and the second type of pattern is a normal pattern having an influence on the function of the semiconductor device; and correcting electron beam exposure data on a second type of pattern without correcting electron beam exposure data on a first type of pattern;

wherein, in the correcting the electron beam exposure data on the second type of pattern, a proximity effect correction is performed; and in the proximity effect correction, electron beam exposure data for a variable rectangular exposure is selected from the electron beam exposure data for the variable rectangular exposure and electron beam exposure data for a one-shot exposure, and only regarding the electron beam exposure data for the variable rectangular exposure, a center portion and contour portions of the pattern of the electron beam exposure data are divided, and second exposure amounts of the contour portions are made larger than first exposure amounts of the contour portions in the electron beam exposure amounts, and said dummy pattern is not divided.

* * * * *

UNITED STATES PATENT AND TRADEMARK OFFICE
CERTIFICATE OF CORRECTION

PATENT NO. : 7,569,842 B2 Page 1 of 1
APPLICATION NO. : 11/506171
DATED : August 4, 2009
INVENTOR(S) : Hiroshi Takita It is certified that error appears in the above-identified patent and that said Letters Patent is hereby corrected as shown below:

Title Page, Item (57) (Abstract), Line 8, change "is" to --is,--.

Column 14, Line 32-33, change "comprises;" to --comprises:--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,569,842 B2 |
| APPLICATION NO. | : 11/506171 |
| DATED | : August 4, 2009 |
| INVENTOR(S) | : Hiroshi Takita |

It is certified that error appears in the above-identified patent and that said Letters Patent is hereby corrected as shown below:

Title Page, Item (56) (U.S. PATENT DOCUMENTS), insert --6,574,789 6/2003 Yamauchi--.

Signed and Sealed this

Twenty-fourth Day of August, 2010

David J. Kappos
*Director of the United States Patent and Trademark Office*